(12) United States Patent
Lee et al.

(10) Patent No.: US 9,134,567 B2
(45) Date of Patent: Sep. 15, 2015

(54) METHOD FOR MANUFACTURING TRANSPARENT CONDUCTIVE FILM AND METHOD FOR MANUFACTURING CF SUBSTRATE HAVING CONDUCTIVE FILM

(71) Applicant: Shenzhen China Star Optoelectronics Technology Co., Ltd., Shenzhen, Guangdong (CN)

(72) Inventors: Kuancheng Lee, Shenzhen (CN); Yewen Wang, Shenzhen (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 122 days.

(21) Appl. No.: 14/126,430

(22) PCT Filed: Nov. 4, 2013

(86) PCT No.: PCT/CN2013/086480
§ 371 (c)(1),
(2) Date: Dec. 15, 2013

(87) PCT Pub. No.: WO2015/058422
PCT Pub. Date: Apr. 30, 2015

(65) Prior Publication Data
US 2015/0125786 A1    May 7, 2015

(30) Foreign Application Priority Data
Oct. 25, 2013  (CN) .......................... 2013 1 0511984

(51) Int. Cl.
| | | |
|---|---|---|
| G02F 1/1335 | (2006.01) | |
| H01B 1/18 | (2006.01) | |
| H01B 13/30 | (2006.01) | |
| G03F 7/00 | (2006.01) | |

(52) U.S. Cl.
CPC ........ *G02F 1/133516* (2013.01); *G03F 7/0007* (2013.01); *H01B 1/18* (2013.01); *H01B 13/30* (2013.01)

(58) Field of Classification Search
CPC ............ G03F 7/0007; G02F 1/133516; G02F 1/13439; G02B 5/20; G02B 5/223; H01B 1/18; H01B 5/14; H01B 13/30
USPC ........ 430/7; 349/106; 427/108, 164, 165, 337
See application file for complete search history.

(56) References Cited

U.S. PATENT DOCUMENTS

2012/0161192 A1* 6/2012 Kim et al. ........................ 257/99
2013/0306915 A1* 11/2013 Lee et al. ...................... 252/502

FOREIGN PATENT DOCUMENTS

| CN | 102142294 A | 8/2011 |
|---|---|---|
| CN | 103021503 A | 11/2011 |
| CN | 102426868 A | 4/2012 |
| CN | 102610331 A | 7/2012 |
| CN | 103021503 A | 4/2013 |
| CN | 103021574 A | 4/2013 |

OTHER PUBLICATIONS

Becerril et al., Evaluation of Solution-Processed Reduced Graphene Oxide Films as Transparent Conductors:, ACS Nano, vol. 2 No. 3, pp. 463-470 (Feb. 2008).*

* cited by examiner

*Primary Examiner* — John A McPherson
(74) *Attorney, Agent, or Firm* — Andrew C. Cheng

(57) ABSTRACT

The present invention provides a method for manufacturing a transparent conductive film and a method for manufacturing a CF substrate having the transparent conductive film. The method for manufacturing a conductive film includes: step 1: dissolving a mixed powder of graphene oxide and pure graphene in water and carrying out an ultrasonic treatment to obtain a stable aqueous solution of mixed graphene oxide and pure graphene; step 2: coating the stable aqueous solution of mixed graphene oxide and pure graphene on a substrate; step 3: subjecting the aqueous solution of mixed graphene oxide and pure graphene that is coated on the substrate to a drying treatment at 30-90° C. so as to obtain a film of mixed graphene oxide and pure graphene; step 4: applying a reducing agent to cause chemical reduction of the graphene oxide contained in the film of mixed graphene oxide and pure graphene so as to obtain a film of pure graphene, wherein the reducing agent is an ascorbic acid solution; and step 5: washing and drying the film of pure graphene obtained after chemical reduction so as to form a transparent conductive film on the substrate.

14 Claims, 3 Drawing Sheets

METHOD FOR MANUFACTURING TRANSPARENT CONDUCTIVE FILM AND METHOD FOR MANUFACTURING CF SUBSTRATE HAVING CONDUCTIVE FILM

BACKGROUND OF THE INVENTION

1. Field of the Invention

The present invention relates to the field of manufacture of liquid crystal display, and in particular to a method for manufacturing a transparent conductive film and a method for manufacturing a CF (Color Filter) substrate having the conductive film.

2. The Related Arts

Heretofore, a commonly used transparent conductive material is a metal oxide mixed transparent conductive material, such as indium tin oxide (ITO), indium zinc oxide (IZO), and aluminum-doped zinc oxide (AZO), among which the most commonly used one is the ITO transparent conductive material that has a light transmittance as high as 90%. However, element indium is a rare and expensive metal and the manufacture of ITO film requires high degree of vacuum and a relatively high temperature. The ITO film so obtained is brittle, making it difficult to make a flexible electrode. These limit further development of the ITO transparent conductive material.

Recently, researches revealed that graphene is a novel carbon based material having a two-dimensional honeycomb structure formed by a single layer of densely packed carbon atoms. Graphene is the thinnest but hardest nanometer material that is currently known and is almost perfectly clear, absorbing 2.3% of light and having an electric resistivity of around $10^{-6} \Omega \cdot cm$, which is lower than that of copper or silver, making it a material of lowest electric resistivity that is currently known, and can be manufactured by various processes, such as chemical vapor deposition (CVD), micro-machine exfoliation, and epitaxial growth. Since graphene has an electrical conductivity that matches ITO and has a light transmittance as high as 97% and also since graphene has mechanical strength and flexibility both superior to the ITO transparent conductive material, graphene can be used completely in place of ITO in making a transparent conductive electrode or conductive layer. Further, graphene made with a CVD process is of low manufacture cost, requiring no high temperature and high pressure, and grapheme has unmatchable superiority to ITO transparent conductive materials in flexible displaying. Thus, grapheme has a more prosperous future of application.

It is thus desired to provide a graphene transparent conductive film having various parameters that are all suitable to replace the ITO transparent conductive film for application in an CF substrate of a liquid crystal display in order to acquire an electrode of a graphene transparent conductive film having high transmittance and excellent flexibility to accordingly improve the transmittance of a CF substrate of a liquid crystal display panel that uses graphene transparent conductive material and reduce the use of backlighting.

SUMMARY OF THE INVENTION

An object of the present invention is to provide a method for manufacturing a transparent conductive film, which is easy to operate and has easily achievable operation conditions and can produce a transparent conductive film that comprises grapheme as a transparent conductive material to provide advantages of having high transmittance and excellent flexibility for substituting the conventional mixed metal oxides based transparent conductive films and showing improved mechanical strength and flexibility.

Another object of the present invention is to provide a method for manufacturing a CF substrate, which uses a graphene transparent conductive film to substitute an ITO transparent conductive film for application in a CF substrate of a liquid crystal display in order to provide a graphene transparent electrode or a static electricity drain layer that has the advantages of high transmittance and excellent flexibility so as to improve the transmittance of a liquid crystal display and reduce the use of backlighting in the application of a liquid crystal display panel.

To achieve the above objects, the present invention provides a method for manufacturing a transparent conductive film, which comprises the following steps:

(1) dissolving a mixed powder of graphene oxide and pure graphene in water and carrying out an ultrasonic treatment to obtain a stable aqueous solution of mixed graphene oxide and pure graphene;

(2) coating the stable aqueous solution of mixed graphene oxide and pure graphene on a substrate;

(3) subjecting the aqueous solution of mixed graphene oxide and pure graphene that is coated on the substrate to a drying treatment at 30-90° C. so as to obtain a film of mixed graphene oxide and pure graphene;

(4) applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone; and (5) washing and drying the film of pure graphene obtained after chemical reduction so as to obtain a transparent conductive film, whereby the transparent conductive film is formed on the substrate.

The ultrasonic treatment is carried out a time period of 10-60 minute. The stable aqueous solution of mixed graphene oxide and pure graphene has a concentration of 0.2-5 mg/mL. In step (2), spin coating, scrape coating, or spray coating is adopted to coat the aqueous solution of mixed graphene oxide and pure graphene on the substrate. The substrate is a glass substrate, a plastic substrate, or a CF substrate body on which a conductive film is to be formed. The film of mixed graphene oxide and pure graphene has a thickness of 0.68-3.4 nm.

Step (4) is carried out as follows: in room temperature, the reducing agent is spray-coated to a surface of the film of mixed graphene oxide and pure graphene to cause chemical reduction of the graphene oxide contained in the film of mixed graphene oxide and pure graphene; and when the reducing agent is an ascorbic acid solution, the concentration thereof is 0.01-0.1 mol/L.

The transparent conductive film has transmittance of visible light of 80-95% and surface resistance of 30-500Ω/□.

The present invention also provides a method for manufacturing a CF (Color Filter) substrate, which comprises the following steps:

(11) dissolving a mixed powder of graphene oxide and pure graphene in water and carrying out an ultrasonic treatment to obtain a stable aqueous solution of mixed graphene oxide and pure graphene;

(12) providing a CF substrate body, wherein the CF substrate body comprises a glass substrate and a color resist layer formed on the glass substrate;

(13) coating the stable aqueous solution of mixed graphene oxide and pure graphene on the CF substrate body;

(14) subjecting the aqueous solution of mixed graphene oxide and pure graphene that is coated on the CF substrate body to a drying treatment at 30-90° C. so as to obtain a film of mixed graphene oxide and pure graphene;

(15) applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone; and

(16) washing and drying the film of pure graphene obtained after chemical reduction so as to obtain a transparent conductive film, whereby the transparent conductive film is formed on the CF substrate body, wherein the transparent conductive film has transmittance of visible light of 80-95% and surface resistance of 30-500Ω/□.

The ultrasonic treatment is carried out a time period of 10-60 minutes. The stable aqueous solution of mixed graphene oxide and pure graphene has a concentration of 0.2-5 mg/mL. In step (13), spin coating, scrape coating, or spray coating is adopted to coat the aqueous solution of mixed graphene oxide and pure graphene on the substrate. The film of mixed graphene oxide and pure graphene has a thickness of 0.68-3.4 nm.

Step (15) is carried out as follows: in room temperature, the reducing agent is spray-coated to a surface of the film of mixed graphene oxide and pure graphene to cause chemical reduction of the graphene oxide contained in the film of mixed graphene oxide and pure graphene; and when the reducing agent is an ascorbic acid solution, the concentration thereof is 0.01-0.1 mol/L.

The color resist layer is formed on glass substrate through yellow light lithography. The color resist layer comprises a plurality of pixel units arranged in a matrix and black matrices formed on outer circumferences of the pixel units.

The transparent conductive film is formed on a surface of the color resist layer that is distant from the glass substrate to serve as a transparent electrode.

The transparent conductive film is formed on a surface of the glass substrate that is distant from the color resist layer to serve as a static electricity drain layer.

The present invention further provides a method for manufacturing a CF (Color Filter) substrate, which comprises the following steps:

(11) dissolving a mixed powder of graphene oxide and pure graphene in water and carrying out an ultrasonic treatment to obtain a stable aqueous solution of mixed graphene oxide and pure graphene;

(12) providing a CF substrate body, wherein the CF substrate body comprises a glass substrate and a color resist layer formed on the glass substrate;

(13) coating the stable aqueous solution of mixed graphene oxide and pure graphene on the CF substrate body;

(14) subjecting the aqueous solution of mixed graphene oxide and pure graphene that is coated on the CF substrate body to a drying treatment at 30-90° C. so as to obtain a film of mixed graphene oxide and pure graphene;

(15) applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone; and

(16) washing and drying the film of pure graphene obtained after chemical reduction so as to obtain a transparent conductive film, whereby the transparent conductive film is formed on the CF substrate body, wherein the transparent conductive film has transmittance of visible light of 80-95% and surface resistance of 30-500Ω/□;

wherein the ultrasonic treatment is carried out a time period of 10-60 minutes; the stable aqueous solution of mixed graphene oxide and pure graphene has a concentration of 0.2-5 mg/mL; in step (13), spin coating, scrape coating, or spray coating is adopted to coat the aqueous solution of mixed graphene oxide and pure graphene on the substrate; and the film of mixed graphene oxide and pure graphene has a thickness of 0.68-3.4 nm; and wherein step (15) is carried out as follows: in room temperature, the reducing agent is spray-coated to a surface of the film of mixed graphene oxide and pure graphene to cause chemical reduction of the graphene oxide contained in the film of mixed graphene oxide and pure graphene; and when the reducing agent is an ascorbic acid solution, the concentration thereof is 0.01-0.1 mol/L.

The color resist layer is formed on glass substrate through yellow light lithography. The color resist layer comprises a plurality of pixel units arranged in a matrix and black matrices formed on outer circumferences of the pixel units.

The transparent conductive film is formed on a surface of the color resist layer that is distant from the glass substrate to serve as a transparent electrode.

The transparent conductive film is formed on a surface of the glass substrate that is distant from the color resist layer to serve as a static electricity drain layer.

The efficacy of the present invention is that the present invention provides a method for manufacturing a transparent conductive film, which coats an aqueous solution of mixed graphene oxide and pure graphene on a glass substrate and applies reduction to obtain a high-purity graphene film to serve as a transparent electrode material, which is easy to operate and can be practiced readily achieved, so that the cost is low and the graphene transparent conductive film so manufactured has electrical conductivity that compares with that of an ITO-made transparent conductive film and light transmittance reaching 95%. Further, the graphene transparent conductive film so manufactured has better mechanical strength and flexibility than an ITO-made transparent conductive film and is more suitable for the fields of flexible substrate, such as organic light-emitting display substrate. The graphene transparent conductive film is applicable to the field of liquid crystal displaying to make a CF substrate having the graphene transparent conductive film. The method for manufacturing the CF substrate is easy to operate and can be readily practiced so that the cost is low. Since the graphene transparent conductive film that has better light transmittance, mechanical strength, and flexibility is used to replace an ITO transparent conductive film, a CF substrate that is so manufactured to comprise the graphene transparent conductive film can be applied to a liquid crystal display panel to enhance the transmittance of the liquid crystal display panel and reduce the use of backlighting.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
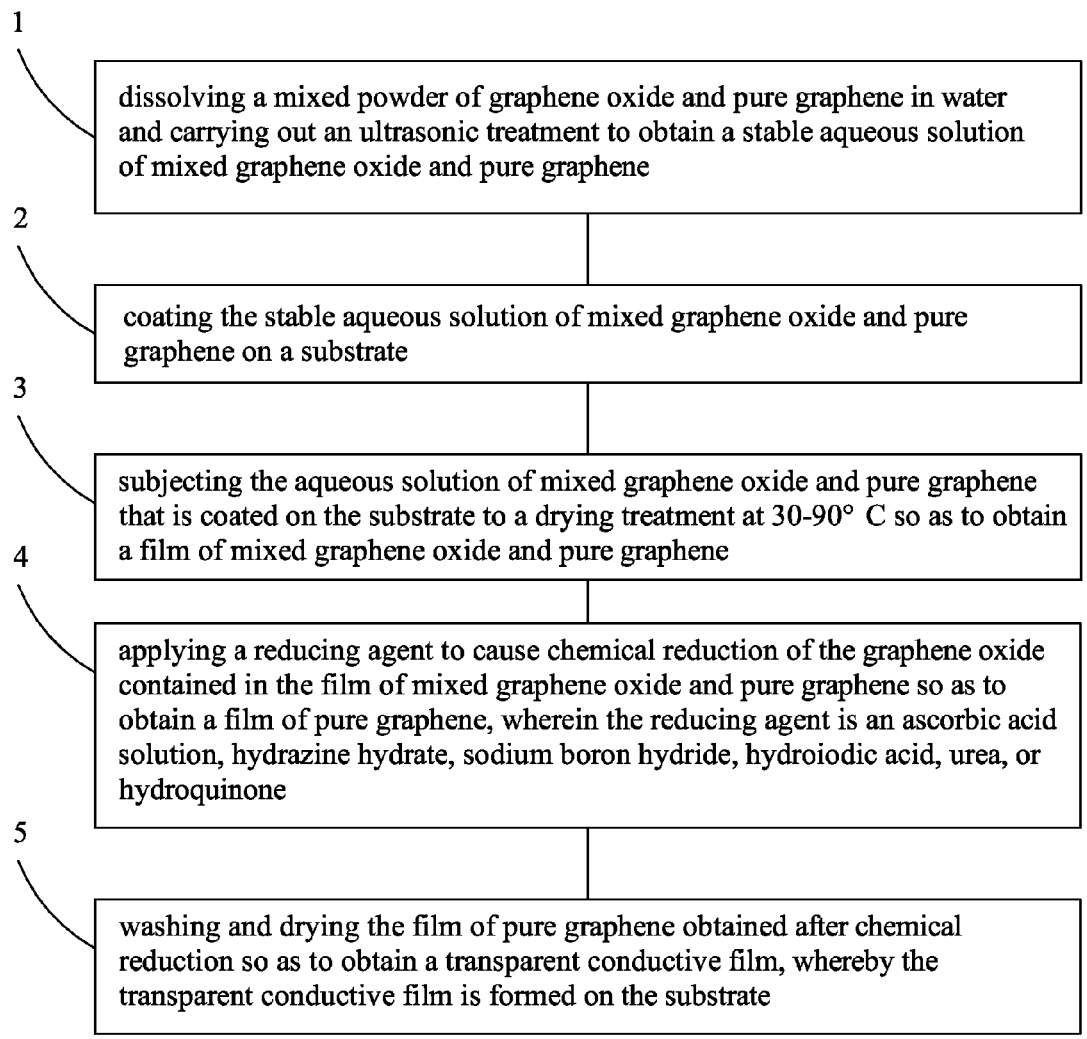
FIG. 1 is a flow chart illustrating a method for manufacturing a transparent conductive film according to the present invention.

Referring to FIG. 1, the present invention provides a method for manufacturing a transparent conductive film, which has easy operation, easily achievable operation conditions, and relatively lower cost and specifically comprises the following steps:

Step 1: dissolving a mixed powder of graphene oxide and pure graphene in water and carrying out an ultrasonic treatment to obtain a stable aqueous solution of mixed graphene oxide and pure graphene.

Specifically, the mixed powder of graphene oxide and pure graphene that is dissolved in water is subjected to the ultrasonic treatment for 10-60 minutes so that after the ultrasonic treatment, a stable aqueous solution of mixed graphene oxide and pure graphene is obtain, having a concentration of 0.2-5 mg/mL.

Step 2: coating the stable aqueous solution of mixed graphene oxide and pure graphene on a substrate.

In Step 2, spin coating, scrape coating, or spray coating is adopted to coat the aqueous solution of mixed graphene oxide and pure graphene on the substrate. The substrate can be a glass substrate, a plastic substrate, or a CF (Color Filter) substrate body on which a conductive film is to be formed.

Step 3: subjecting the aqueous solution of mixed graphene oxide and pure graphene that is coated on the substrate to a drying treatment at 30-90° C. so as to obtain a film of mixed graphene oxide and pure graphene, wherein the film of mixed graphene oxide and pure graphene has a thickness of 0.68-3.4 nm.

Specifically, the substrate on which the aqueous solution of mixed graphene oxide and pure graphene is coated is placed in an environment having a temperature of 30-90° C., until the aqueous solution of mixed graphene oxide and pure graphene on the substrate is dried.

Step 4: applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone.

Specifically, Step 4 is carried out as follows. In the room temperature, the reducing agent is spray-coated to a surface of the film of mixed graphene oxide and pure graphene to cause chemical reduction of the graphene oxide contained in the film of mixed graphene oxide and pure graphene. In the instant embodiment, the reducing agent is preferably an ascorbic acid solution having a concentration of 0.01-0.1 mol/L.

Step 5: washing and drying the film of pure graphene obtained after chemical reduction so as to obtain a transparent conductive film, whereby the transparent conductive film is formed on the substrate.

The transparent conductive film obtained in Step 5 has transmittance of visible light of 80-95% and surface resistance of 30-500Ω/□. The transparent conductive film so made of graphene has excellent electrical conductivity and light transmittance and can completely replace the conventional transparent conductive films made of indium tin oxides (ITO) for applications in the fields of touch screens, liquid crystal displays, organic photovoltaic cells, and organic light-emitting displays. Further, the graphene-made transparent conductive film has better mechanical strength and flexibility and is thus more suitable for applications in the field of flexible substrate.

Further, the present invention uses graphene oxide and pure graphene both of which can be homogeneously suspended in aqueous solutions in sheet-like layers so as to form a stable aqueous solution or hydrosol. Thus, coating can be made on substrates of various sizes and the thickness can be arbitrarily adjusted.

Figure 2:
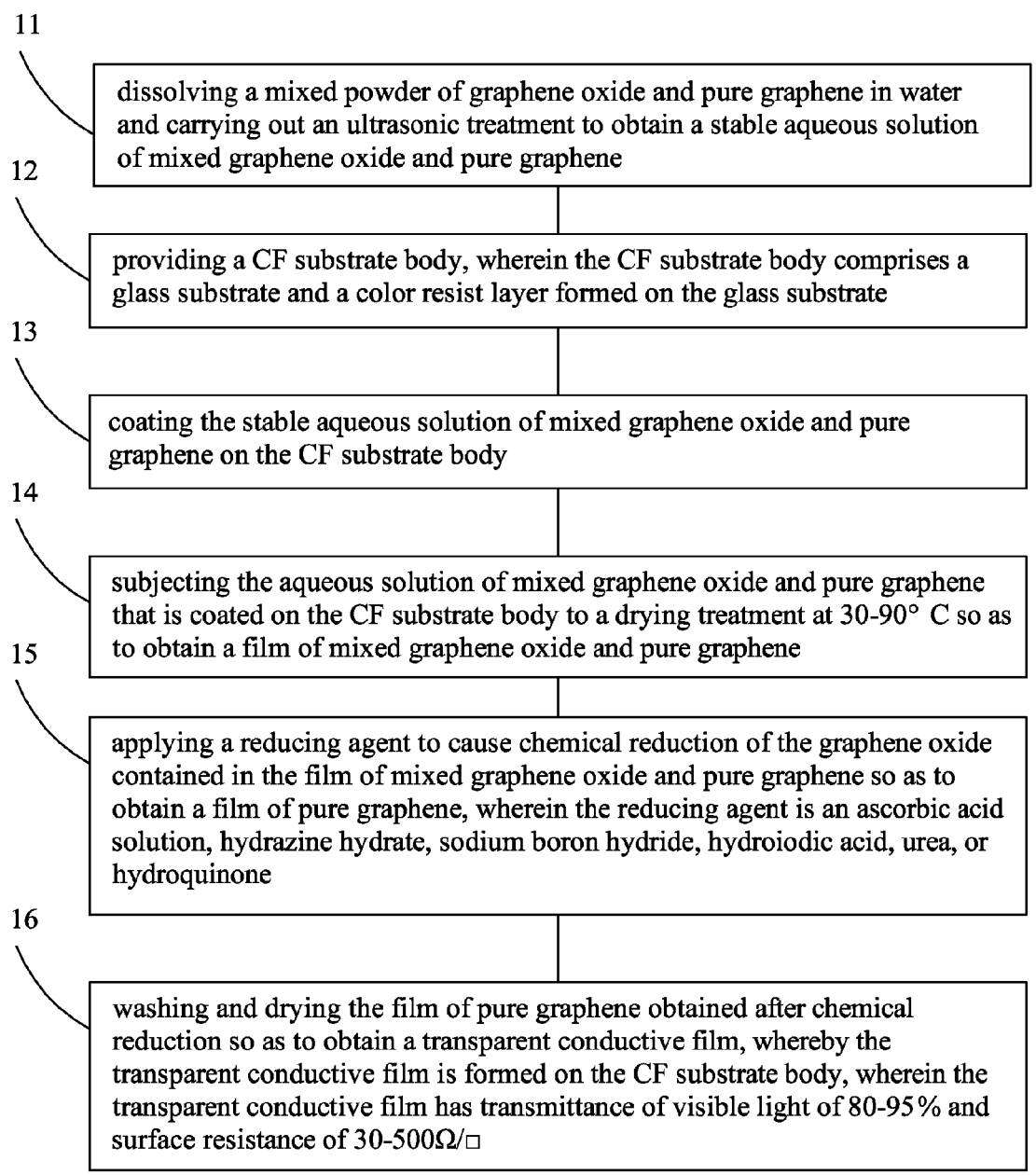
FIG. 2 is a flow chart illustrating a method for manufacturing a CF substrate according to the present invention.
Figure 3:
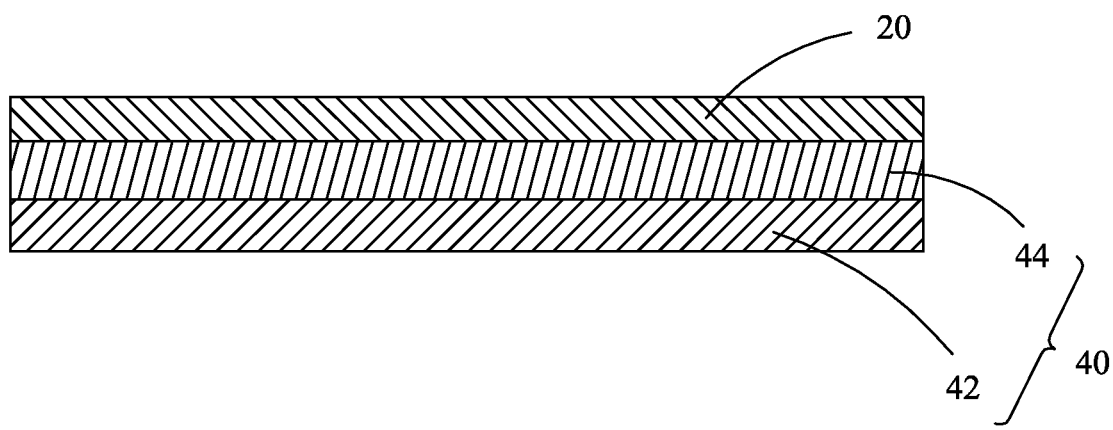
FIG. 3 is a schematic view showing the structure of a first preferred embodiment of a CF substrate manufactured with the method for manufacturing a CF substrate according to the present invention.
Figure 4:
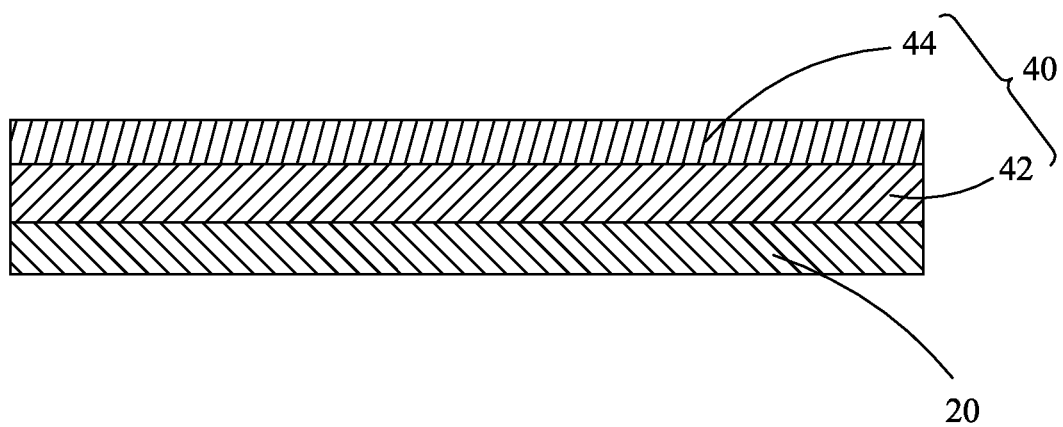
FIG. 4 is a schematic view showing the structure of a second preferred embodiment of a CF substrate manufactured with the method for manufacturing a CF substrate according to the present invention.

Referring to FIGS. 2-4, the present invention also provides a method for manufacturing a CF substrate, which comprises the following steps:

Step 11: dissolving a mixed powder of graphene oxide and pure graphene in water and carrying out an ultrasonic treatment to obtain a stable aqueous solution of mixed graphene oxide and pure graphene.

Specifically, the mixed powder of graphene oxide and pure graphene that is dissolved in water is subjected to the ultrasonic treatment for 10-60 minutes so that after the ultrasonic treatment, a stable aqueous solution of mixed graphene oxide and pure graphene is obtain, having a concentration of 0.2-5 mg/mL.

Step 12: providing a CF substrate body 40, wherein the CF substrate body 40 comprises a glass substrate 42 and a color resist layer 44 formed on the glass substrate 42.

Specifically, the color resist layer 44 is formed on glass substrate 42 through yellow light lithography. The color resist layer 44 comprises a plurality of pixel units arranged in a matrix and black matrices formed on outer circumferences of the pixel units.

Step 13: coating the stable aqueous solution of mixed graphene oxide and pure graphene on the CF substrate body 40.

Specifically, according the specific requirements for the CF substrate body 40 (depending on the display mode with which the CF substrate is to be used), the stable aqueous solution of mixed graphene oxide and pure graphene can be coated on the color resist layer 44 of the CF substrate body 40 (as shown in FIG. 3) to serve as common electrode of a liquid crystal display panel; or the stable aqueous solution of mixed graphene oxide and pure graphene can be coated on a surface of the glass substrate 42 of the CF substrate body 40 that is distant from the color resist layer 44 (as shown in FIG. 4) to serve as a static electricity drain layer.

In Step 13, spin coating, scrape coating, or spray coating is adopted to coat the aqueous solution of mixed graphene oxide and pure graphene on the CF substrate body 40.

Step 14: subjecting the aqueous solution of mixed graphene oxide and pure graphene that is coated on the CF substrate body 40 to a drying treatment at 30-90° C. so as to obtain a film of mixed graphene oxide and pure graphene, wherein the film of mixed graphene oxide and pure graphene has a thickness of 0.68-3.4 nm.

Specifically, the CF substrate body 40 on which the aqueous solution of mixed graphene oxide and pure graphene is coated is placed in an environment having a temperature of 30-90° C., until the aqueous solution of mixed graphene oxide and pure graphene on the CF substrate body 40 is dried.

Step 15: applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone.

Specifically, Step 15 is carried out as follows. In the room temperature, the reducing agent is spray-coated to a surface of the film of mixed graphene oxide and pure graphene to cause chemical reduction of the graphene oxide contained in the film of mixed graphene oxide and pure graphene. In the instant embodiment, the reducing agent is preferably an ascorbic acid solution having a concentration of 0.01-0.1 mol/L.

Step 16: washing and drying the film of pure graphene obtained after chemical reduction so as to obtain a transparent conductive film, whereby the transparent conductive film 20 is formed on the CF substrate body 40, wherein the transparent conductive film 20 has transmittance of visible light of 80-95% and surface resistance of 30-500Ω/□.

The transparent conductive film 20 so made of graphene has excellent electrical conductivity and light transmittance and can completely replace the conventional transparent conductive films 20 made of indium tin oxides (ITO) for applications in the fields of touch screens, liquid crystal displays, organic photovoltaic cells, and organic light-emitting displays. Further, the graphene-made transparent conductive film 20 has better mechanical strength and flexibility and is thus more suitable for applications in the field of flexible substrate. Further, the present invention uses graphene oxide and pure graphene both of which can be homogeneously suspended in aqueous solutions in sheet-like layers so as to form a stable aqueous solution or hydrosol. Thus, coating can be made on substrates of various sizes and the thickness can be arbitrarily adjusted.

Specifically, according to the specific operation of Step 13, the transparent conductive film 20 can be used as a common electrode of a liquid crystal display panel, if formed on the color resist layer 44, to induce, together with a pixel electrode of a TFT (Thin-Film Transistor) substrate (not shown), an electric field for driving liquid crystal molecules to rotate. Under this condition, the CF substrate is generally a CF substrate for use in a high-definition display mode, but is not limited so and can be alternatively a CF substrate for other display modes that require the arrangement of a transparent conductive electrode.

If the transparent conductive film 20 is formed on the surface of a glass substrate 42 that is distant from the color resist layer 44, the transparent conductive film 20 can serve as a static electricity drain layer to drain out static electricity of a liquid crystal display panel so as to extend the life span of the liquid crystal display panel. Further, in the case that an ITO layer is used to serve as a static electricity drain layer, it needs to laminate a protection film on the ITO surface to protect the ITO static electricity drain layer; however, in the present invention, the static electricity drain layer that is made with the graphene transparent conductive film 20 requires no protection layer and the manufacturing cost can be reduced. When the transparent conductive film 20 is used as a static electricity drain layer, the CF substrate is generally a CF substrate for an IPS (In-Plane Switching) display mode or a CF substrate for an FFS (Fringe Field Switching) display mode, but not limited to serving as CF substrates for these two display modes and cam be a CF substrate for other display modes that requires a static electricity drain layer attached thereto.

In summary, the present invention provides a method for manufacturing a transparent conductive film, which coats an aqueous solution of mixed graphene oxide and pure graphene on a glass substrate and applies reduction to obtain a high-purity graphene film to serve as a transparent electrode material, which is easy to operate and can be practiced readily achieved, so that the cost is low and the graphene transparent conductive film so manufactured has electrical conductivity that compares with that of an ITO-made transparent conductive film and light transmittance reaching 95%. Further, the graphene transparent conductive film so manufactured has better mechanical strength and flexibility than an ITO-made transparent conductive film and is more suitable for the fields of flexible substrate, such as organic light-emitting display substrate. The graphene transparent conductive film is applicable to the field of liquid crystal displaying to make a CF substrate having the graphene transparent conductive film. The method for manufacturing the CF substrate is easy to operate and can be readily practiced so that the cost is low. Since the graphene transparent conductive film that has better light transmittance, mechanical strength, and flexibility is used to replace an ITO transparent conductive film, a CF substrate that is so manufactured to comprise the graphene transparent conductive film can be applied to a liquid crystal display panel to enhance the transmittance of the liquid crystal display panel and reduce the use of backlighting.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a transparent conductive film, comprising the following steps:
   (1) dissolving a mixed powder of graphene oxide and pure graphene in water and carrying out an ultrasonic treatment to obtain a stable aqueous solution of mixed graphene oxide and pure graphene;
   (2) coating the stable aqueous solution of mixed graphene oxide and pure graphene on a substrate;
   (3) subjecting the aqueous solution of mixed graphene oxide and pure graphene that is coated on the substrate to a drying treatment at 30-90° C. so as to obtain a film of mixed graphene oxide and pure graphene;
   (4) applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone; and
   (5) washing and drying the film of pure graphene obtained after chemical reduction so as to obtain a transparent conductive film, whereby the transparent conductive film is formed on the substrate.

2. The method for manufacturing a transparent conductive film as claimed in claim 1, wherein the ultrasonic treatment is carried out a time period of 10-60 minutes; the stable aqueous solution of mixed graphene oxide and pure graphene has a concentration of 0.2-5 mg/mL; in step (2), spin coating, scrape coating, or spray coating is adopted to coat the aqueous solution of mixed graphene oxide and pure graphene on the substrate; the substrate is a glass substrate, a plastic substrate, or a CF substrate body on which a conductive film is to be formed; and the film of mixed graphene oxide and pure graphene has a thickness of 0.68-3.4 nm.

3. The method for manufacturing a transparent conductive film as claimed in claim 2, wherein step (4) is carried out as follows: in room temperature, the reducing agent is spray-coated to a surface of the film of mixed graphene oxide and pure graphene to cause chemical reduction of the graphene oxide contained in the film of mixed graphene oxide and pure graphene; and when the reducing agent is an ascorbic acid solution, the concentration thereof is 0.01-0.1 mol/L.

4. The method for manufacturing a transparent conductive film as claimed in claim 1, wherein the transparent conductive film has transmittance of visible light of 80-95% and surface resistance of 30-500Ω/□.

5. A method for manufacturing a CF (Color Filter) substrate, comprising the following steps:
(11) dissolving a mixed powder of graphene oxide and pure graphene in water and carrying out an ultrasonic treatment to obtain a stable aqueous solution of mixed graphene oxide and pure graphene;
(12) providing a CF substrate body, wherein the CF substrate body comprises a glass substrate and a color resist layer formed on the glass substrate;
(13) coating the stable aqueous solution of mixed graphene oxide and pure graphene on the CF substrate body;
(14) subjecting the aqueous solution of mixed graphene oxide and pure graphene that is coated on the CF substrate body to a drying treatment at 30-90° C. so as to obtain a film of mixed graphene oxide and pure graphene;
(15) applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone; and
(16) washing and drying the film of pure graphene obtained after chemical reduction so as to obtain a transparent conductive film, whereby the transparent conductive film is formed on the CF substrate body, wherein the transparent conductive film has transmittance of visible light of 80-95% and surface resistance of 30-500Ω/□.

6. The method for manufacturing a CF substrate as claimed in claim 5, wherein the ultrasonic treatment is carried out a time period of 10-60 minutes; the stable aqueous solution of mixed graphene oxide and pure graphene has a concentration of 0.2-5 mg/mL; in step (13), spin coating, scrape coating, or spray coating is adopted to coat the aqueous solution of mixed graphene oxide and pure graphene on the substrate; and the film of mixed graphene oxide and pure graphene has a thickness of 0.68-3.4 nm.

7. The method for manufacturing a CF substrate as claimed in claim 6, wherein step (15) is carried out as follows: in room temperature, the reducing agent is spray-coated to a surface of the film of mixed graphene oxide and pure graphene to cause chemical reduction of the graphene oxide contained in the film of mixed graphene oxide and pure graphene; and when the reducing agent is an ascorbic acid solution, the concentration thereof is 0.01-0.1 mol/L.

8. The method for manufacturing a CF substrate as claimed in claim 5, wherein the color resist layer is formed on glass substrate through yellow light lithography, the color resist layer comprising a plurality of pixel units arranged in a matrix and black matrices formed on outer circumferences of the pixel units.

9. The method for manufacturing a CF substrate as claimed in claim 5, wherein the transparent conductive film is formed on a surface of the color resist layer that is distant from the glass substrate to serve as a transparent electrode.

10. The method for manufacturing a CF substrate as claimed in claim 5, wherein the transparent conductive film is formed on a surface of the glass substrate that is distant from the color resist layer to serve as a static electricity drain layer.

11. A method for manufacturing a CF (Color Filter) substrate, comprising the following steps:
(11) dissolving a mixed powder of graphene oxide and pure graphene in water and carrying out an ultrasonic treatment to obtain a stable aqueous solution of mixed graphene oxide and pure graphene;
(12) providing a CF substrate body, wherein the CF substrate body comprises a glass substrate and a color resist layer formed on the glass substrate;
(13) coating the stable aqueous solution of mixed graphene oxide and pure graphene on the CF substrate body;
(14) subjecting the aqueous solution of mixed graphene oxide and pure graphene that is coated on the CF substrate body to a drying treatment at 30-90° C. so as to obtain a film of mixed graphene oxide and pure graphene;
(15) applying a reducing agent to cause chemical reduction of the graphene oxide contained in the film of mixed graphene oxide and pure graphene so as to obtain a film of pure graphene, wherein the reducing agent is an ascorbic acid solution, hydrazine hydrate, sodium boron hydride, hydroiodic acid, urea, or hydroquinone; and
(16) washing and drying the film of pure graphene obtained after chemical reduction so as to obtain a transparent conductive film, whereby the transparent conductive film is formed on the CF substrate body, wherein the transparent conductive film has transmittance of visible light of 80-95% and surface resistance of 30-500Ω/□;
wherein the ultrasonic treatment is carried out a time period of 10-60 minutes; the stable aqueous solution of mixed graphene oxide and pure graphene has a concentration of 0.2-5 mg/mL; in step (13), spin coating, scrape coating, or spray coating is adopted to coat the aqueous solution of mixed graphene oxide and pure graphene on the substrate; and the film of mixed graphene oxide and pure graphene has a thickness of 0.68-3.4 nm; and
wherein step (15) is carried out as follows: in room temperature, the reducing agent is spray-coated to a surface of the film of mixed graphene oxide and pure graphene to cause chemical reduction of the graphene oxide contained in the film of mixed graphene oxide and pure graphene; and when the reducing agent is an ascorbic acid solution, the concentration thereof is 0.01-0.1 mol/L.

12. The method for manufacturing a CF substrate as claimed in claim 11, wherein the color resist layer is formed on glass substrate through yellow light lithography, the color resist layer comprising a plurality of pixel units arranged in a matrix and black matrices formed on outer circumferences of the pixel units.

13. The method for manufacturing a CF substrate as claimed in claim 11, wherein the transparent conductive film is formed on a surface of the color resist layer that is distant from the glass substrate to serve as a transparent electrode.

14. The method for manufacturing a CF substrate as claimed in claim 11, wherein the transparent conductive film is formed on a surface of the glass substrate that is distant from the color resist layer to serve as a static electricity drain layer.

* * * * *